United States Patent
Breitlow et al.

(10) Patent No.: US 12,399,518 B2
(45) Date of Patent: Aug. 26, 2025

(54) DYNAMIC CALIBRATION OF A CONTROL SYSTEM CONTROLLING A HEATER

(71) Applicant: Watlow Electric Manufacturing Company, St. Louis, MO (US)

(72) Inventors: Stanton H. Breitlow, Winona, MN (US); Matthew Yender, St. Louis, MO (US); Brittany Phillips, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 915 days.

(21) Appl. No.: 17/184,078

(22) Filed: Feb. 24, 2021

(65) Prior Publication Data

US 2021/0263542 A1  Aug. 26, 2021

Related U.S. Application Data

(60) Provisional application No. 62/980,738, filed on Feb. 24, 2020.

(51) Int. Cl.
*H01L 21/67* (2006.01)
*G05D 23/19* (2006.01)
*G05D 23/24* (2006.01)

(52) U.S. Cl.
CPC ..... *G05D 23/2401* (2013.01); *G05D 23/1934* (2013.01)

(58) Field of Classification Search
CPC ............ G05D 23/2401; G05D 23/1934; H01L 21/67103; H01L 21/67248; H05B 1/0233;
(Continued)

(56) References Cited

U.S. PATENT DOCUMENTS 8,064,233 B2  11/2011  Ishizu et al.
2008/0124101 A1*  5/2008  Takahashi .......... G03G 15/1675
399/44

(Continued)

FOREIGN PATENT DOCUMENTS

CN  201548349  8/2010
JP  2017228230 A  12/2017
(Continued)

OTHER PUBLICATIONS

Search Report issued in Taiwanese Application No. 110106553, mailed Dec. 22, 2021, 2 pages.
(Continued)

*Primary Examiner* — Tiffany T Tran
(74) *Attorney, Agent, or Firm* — Burris Law, PLLC

(57) ABSTRACT

A method of dynamically calibrating a heater having a plurality of zones defined by one or more resistive heating elements includes controlling power to a heater having a plurality of zones based on a dynamic resistance-temperature (R-T) model to control a temperature of the heater to a temperature setpoint. For each of the plurality of zones, the method further includes measuring a temperature of a respective zone based on a resistance of the resistive heating elements of the respective zone and the dynamic R-T model, measuring a reference temperature for the respective zone, and incrementally adjusting a resistance value associated with the temperature setpoint provided in the dynamic R-T model for the respective zone to a calibrated resistance value. The method further includes providing the dynamic R-T model that correlates the calibrated resistance values of the plurality of zones with the temperature setpoint as a calibrated R-T model.

20 Claims, 11 Drawing Sheets

(58) Field of Classification Search
CPC ........ H05B 2203/035; H05B 2203/036; H05B 2203/037
See application file for complete search history.

(56) References Cited

U.S. PATENT DOCUMENTS

| | | | | |
|---|---|---|---|---|
| 2009/0102552 | A1* | 4/2009 | Shiramizu | H03G 1/0023 330/98 |
| 2010/0294021 | A1* | 11/2010 | Makino | G01N 25/18 73/204.11 |
| 2015/0055940 | A1* | 2/2015 | Steinhauser | H01L 21/67109 219/490 |
| 2015/0112631 | A1* | 4/2015 | Steffas | G01K 7/16 702/133 |
| 2015/0228880 | A1* | 8/2015 | Yoshida | H10N 10/853 438/54 |
| 2018/0269089 | A1* | 9/2018 | Merchant | G01J 5/0007 |
| 2019/0231992 | A1* | 8/2019 | Skoda | A24F 40/65 |
| 2019/0338422 | A1 | 11/2019 | Durbin et al. | |

FOREIGN PATENT DOCUMENTS

| | | | |
|---|---|---|---|
| JP | 2018502443 | A | 1/2018 |
| JP | 2020512547 | A | 4/2020 |
| TW | 201624588 | | 7/2016 |
| TW | 201642384 | | 12/2016 |
| TW | 201811107 | | 3/2018 |
| TW | 201910761 | | 3/2019 |
| TW | 664873 | | 7/2019 |
| TW | 201946491 | | 12/2019 |
| TW | 201947218 | | 12/2019 |
| WO | 2016069808 | | 5/2016 |
| WO | WO-2019134456 | A1 * | 7/2019 ............ G05D 23/32 |

OTHER PUBLICATIONS

Office Action issued in corresponding KR Application No. 10-2022-7033301, issued Aug. 21, 2024, and an English Translation, 13 pages.

Office Action issued in corresponding JP Application No. 2022-549896, issued Mar. 4, 2025, and an English translation, 6 pages.

\* cited by examiner

| Dynamic R-T Model | | |
|---|---|---|
| Temperature Setpoints | IZ RHE Resistance | OZ RHE Resistance |
| 20.35 °C | 3.205 Ω | 4.205 Ω |
| 250.00 °C | 61.20 Ω | 59.20 Ω |
| 450.00 °C | 8.635 Ω | 7.635 Ω |
| 600.00 °C | 11.120 Ω | 10.120 Ω |

| Temperature Setpoints | Dynamic R-T Model | |
|---|---|---|
| | IZ RHE Resistance | OZ RHE Resistance |
| 20.35 °C | 3.205 Ω | 4.205 Ω |
| 250.00 °C | <u>61.15 Ω</u> | 59.20 Ω |
| 450.00 °C | 8.635 Ω | 7.635 Ω |
| 600.00 °C | 11.120 Ω | 10.120 Ω |

FIG. 7

DYNAMIC CALIBRATION OF A CONTROL SYSTEM CONTROLLING A HEATER

CROSS-REFERENCE TO RELATED APPLICATIONS

This application claims priority to and the benefit of U.S. Provisional Application 62/980,738 filed on Feb. 24, 2020. The disclosure of the above application is incorporated herein by reference.

FIELD

The present disclosure relates to calibrating a control system that controls a heater having a plurality of zones.

BACKGROUND

The statements in this section merely provide background information related to the present disclosure and may not constitute prior art.

Heaters typically include resistive heating elements that define one or more heating zones. In some applications, the resistive heating elements function as heaters to generate heat and as sensors to measure temperature. In one form, such resistive heating elements may be defined by a material having a non-linear temperature coefficient of resistance (TCR), and the temperature of the resistive heating elements can be determined based on the resistance of the heating element.

To control the heater, a control system measures the temperature of the resistive heating elements based on the resistance of the resistive heating element(s). Specifically, the control system measures voltage and/or current of the resistive heating element to determine resistance, and using data that correlates resistance and temperature, determines the temperature of the zone(s). While predefined resistance-temperature (R-T) data may be used, heaters may operate differently from each other even if the resistive heating elements are made of the same material. Variation in R-T data can be caused by, for example, manufacturing variations, material batch variations, age of the heater, number of cycles, and/or other factors, and can causes inaccuracies in the calculated temperatures. These and other issues related to the use of resistive heaters operable as sensors, for example in a multizone application, are addressed by the present disclosure.

SUMMARY

This section provides a general summary of the disclosure and is not a comprehensive disclosure of its full scope or all of its features.

In one form, the present disclosure is directed to a method of dynamically calibrating a heater having a plurality of zones defined by one or more resistive heating elements. The method includes controlling power to a heater having a plurality of zones based on a dynamic resistance-temperature (R-T) model to control a temperature of the heater to a temperature setpoint. For each of the plurality of zones, the method further includes measuring a temperature of a respective zone based on a resistance of the one or more resistive heating elements of the respective zone and the dynamic R-T model, measuring a reference temperature for the respective zone, and incrementally adjusting a resistance value associated with the temperature setpoint provided in the dynamic R-T model for the respective zone to a calibrated resistance value. The method further includes providing the dynamic R-T model that correlates the calibrated resistance values of the plurality of zones with the temperature setpoint as a calibrated R-T model.

In one variation, controlling power to the heater further includes measuring resistances of the resistive heating elements, determining the temperature of each of the plurality of zones based on the measured resistance for the respective zone and the dynamic R-T model, and adjusting power to the respective zone in response to the temperature of the respective zone being different from the temperature setpoint until the temperature of the respective zone is equal to the temperature setpoint.

In another variation, when the temperature of each of the plurality of zones equals the temperature setpoint, the method further includes applying a voltage pulse to the plurality of zones and measuring a thermal response of the plurality of zones.

In yet another variation, when the temperature of each of the plurality of zones equals the temperature setpoint, the method further includes adjusting an external system variable and measuring a thermal response of the plurality of zones. The external system variable includes chamber pressures, backside gas pressures, gas flow rates, an emissivity of a chamber, an emissivity of a pedestal, or a combination thereof.

In one variation, incrementally adjusting resistance values further includes, for the respective zone, determining a resistance adjustment rate based on a predefined gain factor and a difference between the reference temperature associated with the respective zone and the temperature of the respective zone.

In another variation, incrementally adjusting resistance values further includes decreasing a resistance value associated with the respective zone when the reference temperature of the respective zone is greater than the temperature of the respective zone, and increasing the resistance value associated with the respective zone when the reference temperature of the respective zone is less than the temperature of the respective zone.

In yet another variation, the reference temperatures of the plurality of zones are measured by one or more sensors.

In one variation, the method further includes applying a nominal measurement voltage to each of the plurality of zones, and measuring a cold start resistance for each of the plurality of zones prior to controlling the temperature of the heater to the temperature setpoint.

In another variation, the temperature setpoint is selected from among a plurality of temperature setpoints and the calibrated resistance values for each of the zones is determined for each of the plurality of temperature setpoints. The dynamic R-T model provides, for each of the plurality of temperature setpoints, the calibrated resistance values for each of the plurality of zones.

In yet another variation, the method further includes thermally leveling the reference temperatures of the plurality of zones such that the reference temperature for a first zone is substantially the same as that of a second zone that is associated with the first zone.

In one variation, the method further includes, for each of the zone, determining whether the temperature of the respective zone is equal to the reference temperature of the respective zone, where the resistance value is incrementally adjusted in response to the temperature not equaling the reference temperature, and storing the resistance value as the calibrated resistance value for the respective zone in response to the temperature of the respective zone equaling the reference temperature.

In one form, the present disclosure is directed to a method of dynamically calibrating a heater having a plurality of zones defined by one or more resistive heating elements. The method includes controlling power to the heater based on a dynamic resistance-temperature (R-T) model to control a temperature of the heater to a temperature setpoint. For each of the plurality of zones, the method includes measuring a reference temperature for a respective zone, measuring a zone temperature for the respective zone based on a resistance of the one or more resistive heating elements of the respective zone and the dynamic R-T model, determining, for the respective zone, whether the zone temperature is equal to the reference temperature, in response to the zone temperature not equaling the reference temperature, incrementally adjusting a resistance value associated with the temperature setpoint in the dynamic R-T model for the respective zone, and in response to the zone temperature equaling the reference temperature, providing the resistance value in the dynamic R-T model as a calibrated resistance value for the temperature setpoint. The method further includes storing the dynamic R-T model as a calibrated R-T model in response to the calibrated resistance values being provided for each of the plurality of zones.

In one variation, the method further includes thermally leveling the reference temperatures of the plurality of zones such that the reference temperature for a first zone is substantially the same as that of a second zone associated with the first zone.

In another variation, the resistance value is stored in the dynamic R-T model as a calibrated resistance value for the temperature setpoint in response to the zone temperature equaling the reference temperature and the plurality of reference temperatures being thermally leveled.

In yet another variation, the temperature setpoint is selected from among a plurality of temperature setpoints, a calibrated resistance value is determined for each of the plurality of temperature setpoints, and the dynamic R-T model provides, for each of the plurality of temperature setpoints, the calibrated resistance values for each of the plurality of zones.

In one variation, incrementally adjusting resistance values further includes determining a resistance adjustment rate based on a predefined gain factor and a difference between the reference temperature and the zone temperature of the respective zone.

In another variation, incrementally adjusting the resistance value for the respective zone further includes decreasing a resistance value associated with the respective zone when the reference temperature of the respective zone is greater than the temperature of the respective zone, and increasing the resistance value associated with the respective zone when the reference temperature of the respective zone is less than the temperature of the respective zone.

In one form, the present disclosure is directed toward a control system for controlling power to a heater having a plurality of zones, where each of the plurality of zones is defined by one or more resistive heating elements. The control system includes a controller configured to control power to the heater and determine a temperature of each of the plurality of zones based on a calibrated resistance-temperature (R-T) model. The controller is configured to execute a dynamic calibration process to define the calibrated R-T model. The dynamic calibration process includes performing, using a dynamic R-T model, a closed-loop temperature control to maintain temperature of the heater to a temperature setpoint. For each of the plurality of zones, the dynamic calibration process further includes obtaining a reference temperature for a respective zone, thermally leveling the reference temperature of the respective zone with one or more other reference temperatures by adjusting the resistive value associated with the respective zone in response to the temperature of the heater not equaling the temperature setpoint, measuring a zone temperature for the respective zone based on a resistance of the one or more resistive heating elements of the respective zone and the dynamic R-T model for the respective zone, determining, for the respective zone, whether the zone temperature is equal to the reference temperature, in response to the zone temperature not equaling the reference temperature, incrementally adjusting the resistance value associated with the temperature setpoint provided in the dynamic R-T model for the respective zone, and in response to the zone temperature equaling the reference temperature and the reference temperature being thermally leveled, providing the resistance value in the dynamic R-T model as a calibrated resistance value for the temperature setpoint for the respective zone. The dynamic calibration process further includes storing the dynamic R-T model that correlates the calibrated resistance values with the temperature setpoint for the plurality of zones as the calibrated R-T model.

In one variation, incrementally adjusting resistance values further includes, determining a resistance adjustment rate based on a predefined gain factor and a difference between the reference temperature and the zone temperature of the respective zone.

In another variation, incrementally adjusting the resistance value for the respective zone further includes decreasing a resistance value associated with the respective zone when the reference temperature of the respective zone is greater than the temperature of the respective zone, and increasing the resistance value associated with the respective zone when the reference temperature of the respective zone is less than the temperature of the respective zone.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 7 illustrates dynamic adjustment of a resistance value provided in the dynamic calibration R-T model of FIG. 4;

Figure 1A:
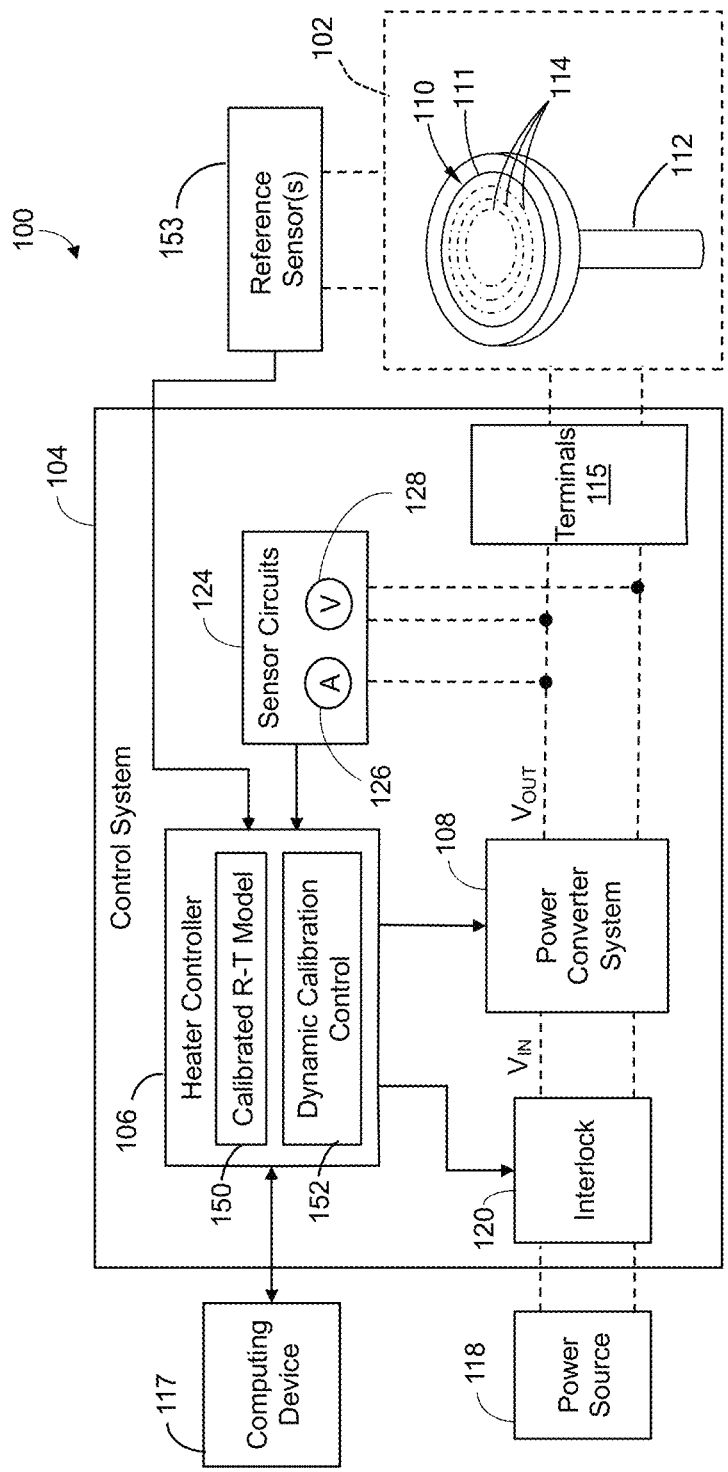
FIG. 1A is a block diagram of a thermal system in accordance with the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure is directed toward a dynamic calibration control to auto-calibrate a control system that operates a heater while controlling temperature of resistive heating elements (i.e., filament temperature). Specifically, the dynamic calibration control dynamically modifies resistance values of a resistance-temperature (R-T) model while the heater is being controlled to a temperature setpoint. The R-T model correlates resistances of the resistive heating elements with the temperature setpoint. The dynamic calibration control adjusts the resistances of the R-T model in controlled increments over a period of time to inhibit disturbance and provide a smoother resistance and filament temperature response. Once calibrated, the R-T model is used to determine the temperature of each zone of the heater during standard operations and control the thermal performance of the heater.

Figure 1B:
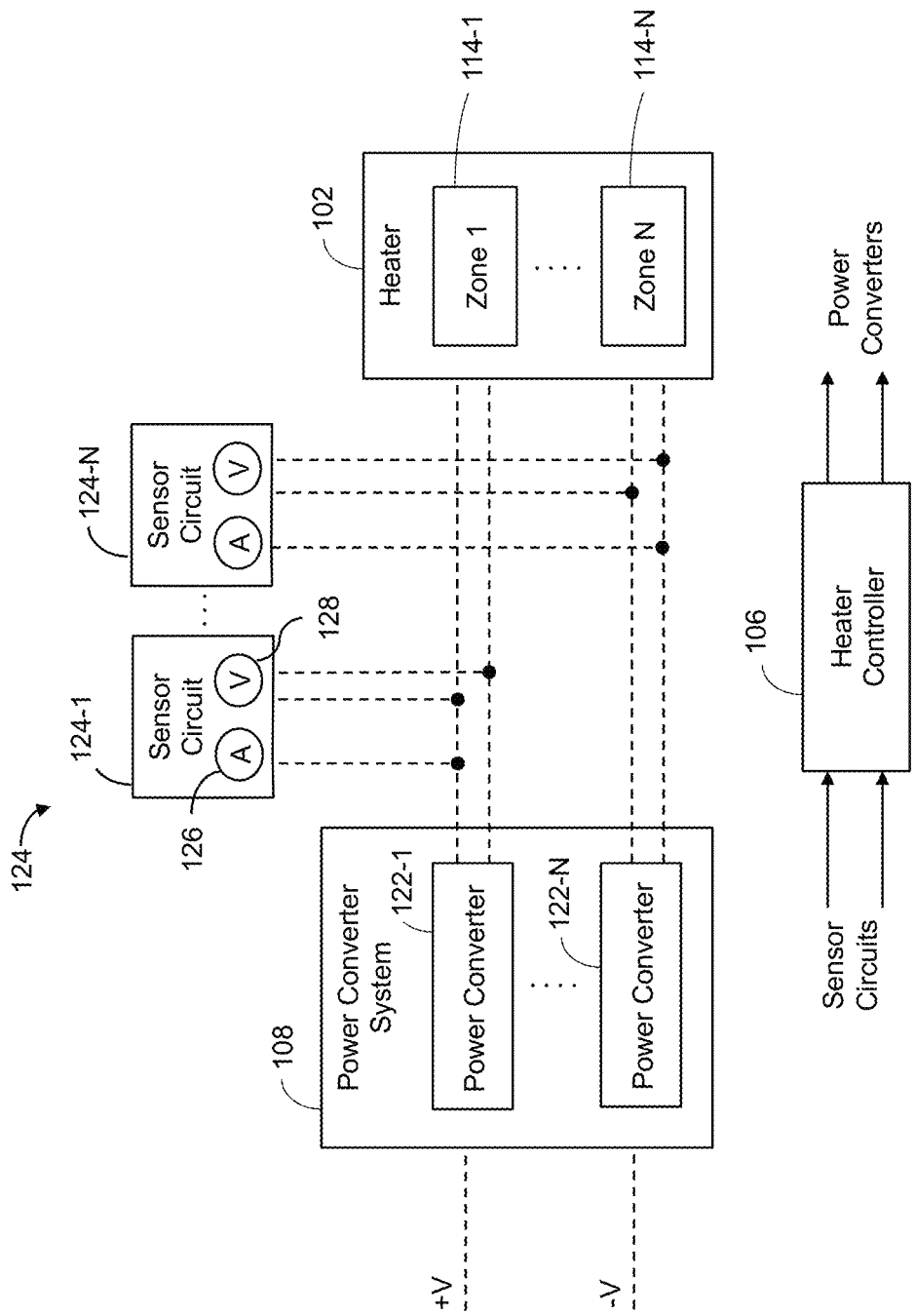
FIG. 1B is a block diagram of a control system of the thermal system of FIG. 1A.
Figure 1D:
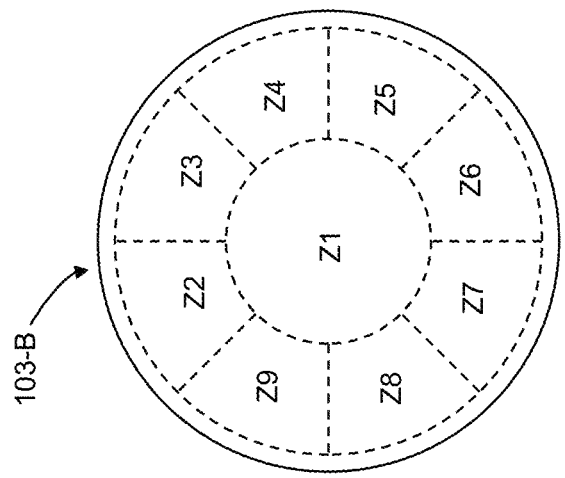
FIGS. 1C and 1D illustrate different variations of a multi-zone heater.
Figure 1C:
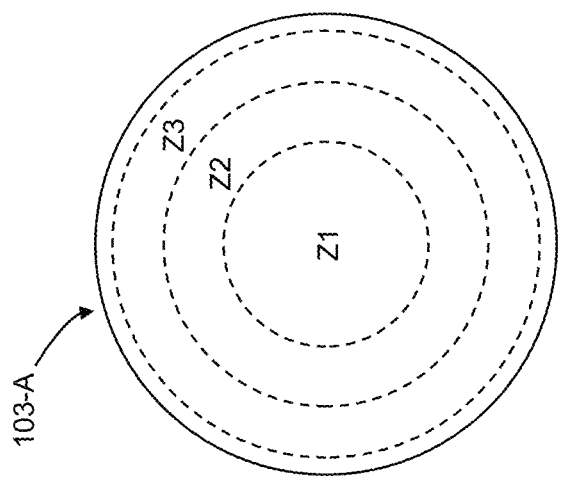

To better understand the dynamic calibration control, an example configuration of a thermal system having a multi-zone heater and a control system is first provided. While the dynamic calibration control is described in association with a multizone heater, the heater may include one or more zones and is not limited to two or more zones. Referring to FIGS. 1A and 1B, a thermal system 100 includes a multizone pedestal heater 102 and a control system 104 having a heater controller 106 and a power converter system 108. In one form, the heater 102 includes a heating plate 110 and a support shaft 112 disposed at a bottom surface of the heating plate 110. The heating plate 110 includes a substrate 111 and a plurality of resistive heating elements (not shown) embedded in or disposed along a surface of the substrate 111. In one form, the substrate 111 may be made of ceramic or aluminum. The resistive heating elements are independently controlled by the control system 104 and define a plurality of heating zones 114 as illustrated by the dashed-dotted lines in FIG. 1A. It is readily understood that the heating zones could be configured in various suitable ways and include two or more heating zones while remaining within the scope of the present disclosure. For example, FIG. 1C illustrates a multi-zone heater 103-A having three zones (Z1-Z3) and FIG. 1D illustrates a multi-zone heater 103-B having nine zones (Z1-Z9).

In one form, the heater 102 is a "two-wire" heater in which the resistive heating elements function as heaters and as temperature sensors with only two leads wires operatively connected to the heating element rather than four. Such two-wire capability is disclosed in, for example, U.S. Pat. No. 7,196,295, which is commonly assigned with the present application and incorporated herein by reference in its entirety. Typically, in a two-wire system, the resistive heating elements are defined by a material that exhibits a varying resistance with varying temperature such that an average temperature of the resistive heating element is determined based on a change in resistance of the resistive heating element. In one form, the resistance of the resistive heating element is calculated by first measuring the voltage across and the current through the heating elements and then, using Ohm's law, the resistance is determined. The resistive heating element may be defined by a relatively high temperature coefficient of resistance (TCR) material, a negative TCR material, or in other words, a material having a non-linear TCR.

The control system 104 controls the operation of the heater 102, and more particularly, is configured to independently control power to each of the zones 114. In one form, the control system 104 is electrically coupled to the zones 114 via terminals 115, such that each zone 114 is coupled to two terminals providing power and sensing temperature.

In one form, the control system 104 is communicably coupled (e.g., wireless and/or wired communication) to a computing device 117 having one or more user interfaces such as a display, a keyboard, a mouse, a speaker, a touch screen, among others. Using the computing device 117, a user may provide inputs or commands such as temperature setpoints, power setpoints, commands to execute a test or a process stored by the control system 104.

The control system 104 is electrically coupled to a power source 118 that supplies an input voltage (e.g., 240V, 208V) to the power converter system 108 by way of an interlock 120. The interlock 120 controls power flowing between the power source 118 and the power converter system 108 and is operable by the heater controller 106 as a safety mechanism to shut-off power from the power source 118. While illustrated in FIG. 1A, the control system 104 may not include the interlock 120.

The power converter system 108 is operable to adjust the input voltage and apply an output voltage (VouT) to the heater 102. In one form, the power converter system 108 includes a plurality of power converters 122 (122-1 to 122-N in FIG. 1B) that are operable to apply an adjustable power to the resistive heating elements of a given zone 114 (114-1 to 114-N in figures). One example of such a power converter system is described in co-pending application U.S. Ser. No. 15/624,060, filed Jun. 15, 2017 and titled "POWER CONVERTER FOR A THERMAL SYSTEM", which is commonly owned with the present application and the contents of which are incorporated herein by reference in its entirety. In this example, each power converter includes a buck converter that is operable by the heater controller to generate a desired output voltage for one or more heating elements of a given zone 114. Accordingly, the power converter system is operable to provide a customizable amount of power (i.e., a desired power) to each zone 114 of the heater 102. It should be readily understood that other power converter systems may be employed for providing the desired power and the present disclosure is not limited to the example provided herein.

With the use of a two-wire heater, the control system 104 includes sensor circuits 124 (i.e., 124-1 to 124-N in FIG. 1B) to measure electrical characteristics of the resistive heating elements (i.e., voltage and/or current), which is then used to determine performance characteristics of the zones 114, such as resistance, temperature, and other suitable information. In one form, a given sensor circuit 124 includes an ammeter 126 and a voltmeter 128 to measure a current flowing through and a voltage applied to the heating element(s) in a given zone 114, respectively. While not depicted, additional circuitry such as shunts and voltage dividers may be implemented as part of the sensor circuit for the ammeters 126 and voltmeter 128. In one form, the ammeter 126 and the voltmeter 128 are provided as a power metering chip to simultaneously measure current and voltage regardless of the power being applied to the heating element. In another form, the voltage and/or current measurements may be taken at zero-crossing, as described in U.S. Pat. No. 7,196,295.

In one form, the heater controller 106 includes one or more microprocessors and memory for storing computer readable instructions executed by the microprocessors. In one form, the heater controller 106 is configured to perform one or more control processes in which the controller 106 determines the desired power to be applied to the zones 114, such as 100% of input voltage, 90% of input voltage, etc. Example control processes are described in co-pending application U.S. Ser. No. 15/624,060 provided above, and co-pending application U.S. Ser. No. 16/100,585, filed Aug. 10, 2018 and titled "SYSTEM AND METHOD FOR CONTROLLING POWER TO A HEATER, which is commonly owned with the present application and the contents of which are incorporated herein by reference in its entirety. In one form, the heater controller 106 performs a closed-loop temperature control in which the temperature of the heater 102 is controlled to a temperature setpoint. For example, using the resistance of the resistive heating elements and a calibrated R-T model 150, the heater controller 106 determines a temperature of the zones 114 and then adjusts the power to the zones 114 to bring the temperature of the zones closer to the temperature setpoint.

In one form, the calibrated R-T model 150 correlates resistance values for a given zone with one or more temperature setpoints. The calibrated R-T model may be provided as one or more lookup tables that correlates, for each zone 114, a calibrated resistance value for a temperature setpoint. The calibrated R-T model 150 may also be provided as one or more algorithms indicative of the non-linear relationship between the temperature and resistance.

In one form, the heater controller 106 is configured to include a dynamic calibration control 152 to dynamically calibrate resistance values of the resistive heating elements with one or more temperature setpoints to provide a calibrated R-T model. As described further herein, the dynamic calibration control 152 performs a temperature setpoint control of the heater 102 based on a dynamic R-T model and incrementally adjusts resistance values associated with a temperature setpoint in the dynamic R-T model to drive the temperature of each zone toward a respective reference temperature. The reference temperature is measured using one or more reference sensors 153, which may be provided by at least one discrete sensor, such as a thermocouple (TC), a TC wafer having a plurality of TCs embedded in a wafer, an infrared camera, an array of temperature probes, and/or other suitable discrete sensors.

Figure 2:
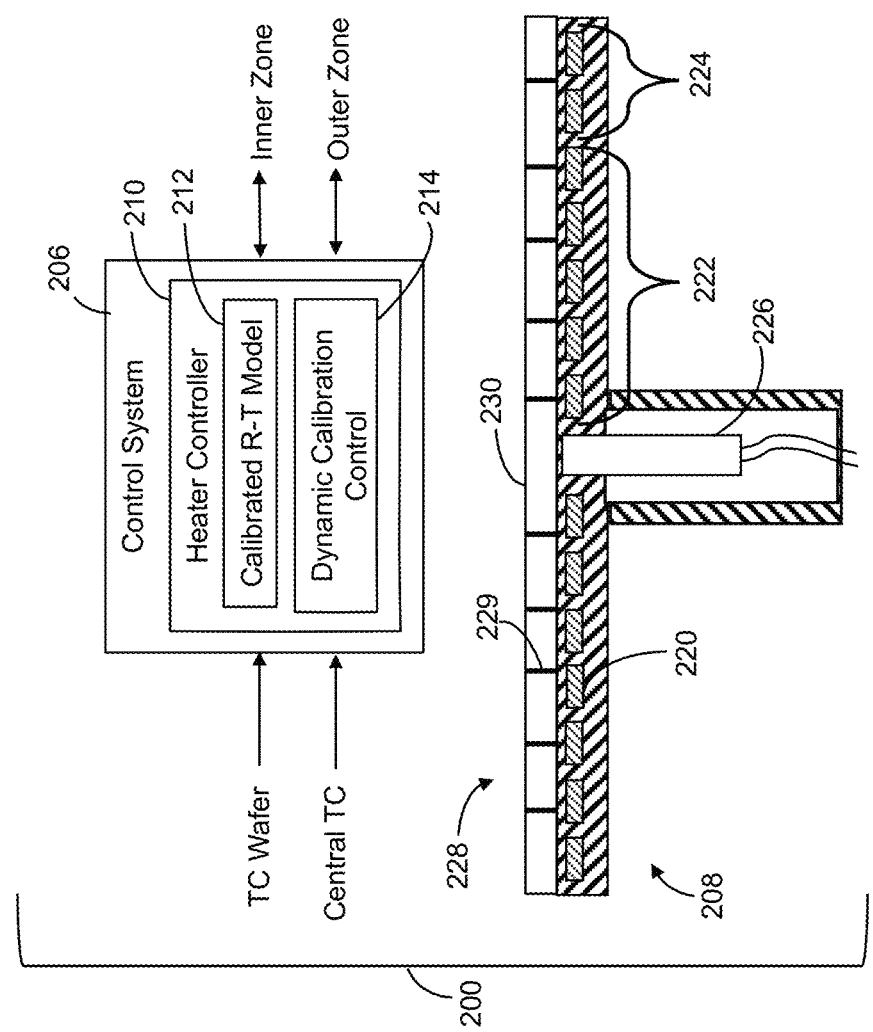
FIG. 2 is a block diagram of a calibration system in accordance with the present disclosure.

Referring to FIG. 2, a calibration system 200 is configured to perform a dynamic calibration control of a thermal system including a control system 206 and a two-zone pedestal heater 208 that is a two-wire heater. In one form, the control system 206 is similar to the control system 104 for controlling a two-wire heater and includes a heater controller 210 that is similar to the heater controller 106. The heater controller 210 includes a calibrated R-T model 212 that correlates the resistance values for each zone with one or more temperature setpoints and a dynamic calibration control 214 for calibrating the two-zone heater 208, as described herein.

The heater 208 includes a plurality of resistive heating elements 220 that define a two-zone heater having an inner zone (IZ) generally identified by reference number 222 and an outer zone (OZ) generally identified by reference number 224. In the following, the inner zone 222 and the outer zone 224 may collectively be referred to as zones 222, 224. While two zones are illustrated, the heater 208 may include one or more zones and a zone may be defined by one or more resistive heating elements.

As provided above, with the two-wire heater, the control system 206 is configured to determine a temperature of each zone 222, 224 based on resistances of the resistive heating elements 220 provided at the respective zone 222, 224 and on a resistance-temperature (R-T) model. In the following, the temperatures of the inner zone 222 and the outer zone 224 may collectively be referred to as zone temperatures and individually as inner temperature and outer temperature, respectively.

The calibration system 200 further includes one or more discrete reference sensors for measuring a reference temperature for each of the zones 222, 224. Here, the reference sensors includes a center TC 226 integrated with the heater 208 and a TC wafer 228 arranged along a surface of the heater 208. The center TC 226 and the TC wafer 228 are communicably coupled to the heater controller 210 via input/output interfaces (not shown). The center TC 226 measures a temperature at the center of the heater 208, which is a reference temperature associated with the inner zone 222.

The TC wafer 228 includes a plurality of TCs 229 distributed within a wafer 230 to obtain multiple temperature measurements along the surface of the heater 208. The TCs 229 provided in a particular area of the wafer 230 are associated with a respective zone 222, 224 of the heater 208. In one form, for each of the zones 222, 224, the temperature measurements taken by the TCs 229 at a respective zone 222, 224 are aggregated and averaged to provide a reference temperature for the respective zone. Accordingly, in lieu of the measurement from the center TC 226, the reference temperature for the inner zone may be based on measurements from the TC wafer 228. It should readily be understood that other reference sensors may be employed. For example, in one variation, an infrared camera is arranged above the heater 208 to obtain thermal images of the heater 208. Each zone of the heater 208 is associated with respective portion of the thermal images to obtain a reference temperature for the zone.

In one form, a virtual TC temperature at the outer zone 224 may be determined as a reference temperature for the outer zone based on temperature measurements from the TC wafer 228 and the center TC 226. Specifically, the virtual TC temperature may be determined using the following in which "T_VTC" is the virtual thermocouple temperature, "T_CTC" is the temperature detected by the center TC 226, "T_IW" is the temperature of the inner portion of the TC wafer and is based on TCs of the TC wafer 228 associated with the inner zone of the heater 208, and "T_OW" is the temperature of the outer portion of the TC wafer 228 and is based on TCs of the TC wafer 228 associated with the outer zone 224 of the heater 208: T_VTC=(T_CTC−T_IW)+T_OW. In the following, the reference temperatures associated with the inner zone and the outer zone may be provided as an inner reference temperature and an outer reference temperature, respectively.

Figures 3, 4:
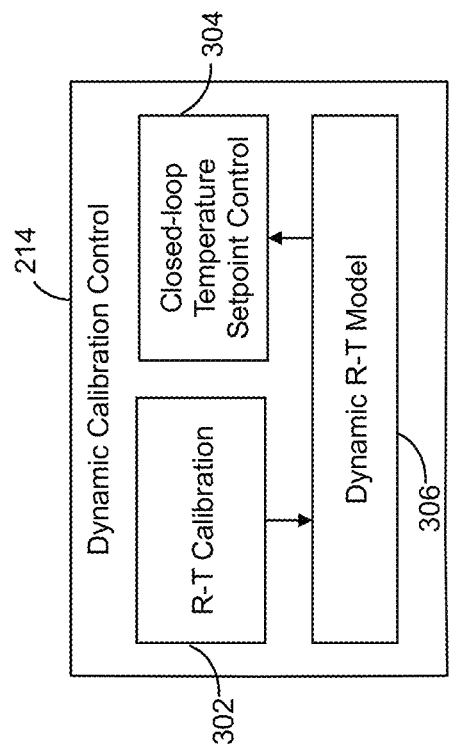
FIG. 3 is a functional block diagram of a dynamic calibration control of FIG. 3.
FIG. 4 is an example of a dynamic calibration resistance-temperature (R-T) model in accordance with the present disclosure.

Referring to FIG. 3, in one form, the dynamic calibration control 214 provides a R-T calibration 302, a closed-loop temperature setpoint control 304 that operates in a similar manner as the closed-loop temperature control described above, and a dynamic R-T model 306. The dynamic R-T model 306 may be the same as the current calibrated R-T model 212 being used to control the heater 208 and is provided in a temporary memory device of the heater controller 210. FIG. 4 provides an example dynamic R-T model as a table 400 that associates multiple temperature setpoints with resistance values of the resistive heating elements ("RHE" in FIG. 4) that define the inner and outer zones 222, 224.

The R-T calibration 302 is configured to select a temperature setpoint to be calibrated and determine, for each zone 222, 224, a calibrated resistance value for the temperature setpoint. Specifically, the closed-loop temperature setpoint control 304 operates the heater 208 to the selected temperature setpoint using the dynamic R-T model 306. Once at the selected temperature setpoint, the R-T calibration 302 determines the reference temperature for each zone 222, 224 based on data from the reference sensors.

In one form, as the closed-loop temperature setpoint control 304 ramps the temperature of the heater 208 to the selected temperature setpoint, the R-T calibration 302 thermally levels the reference sensor. More particularly, the reference temperature of a respective zone is controlled (i.e., adjusted) to be substantially the same as that of one or more selected adjacent zones. For example, with regard to the heater 208, the R-T calibration 302 compares the inner reference temperature and the outer reference temperature. If the inner reference temperature is higher or lower than the outer reference temperature, the resistance value for the resistive heating element of the outer zone is adjusted (i.e., decreased or increased), so that the outer reference temperature is substantially the same as that of the inner reference temperature. Accordingly, the thermal profile of the reference sensor and thus, the heater 208 is substantially uniform. By thermally leveling the reference sensor during ramping, the likelihood of physical damage to the heater 208, such as cracking, may be reduced or inhibited. In another example, with regard to the three-zone heater 103-A of FIG. 1C, the reference temperature of Z2 is thermally leveled with the reference temperature of Z1, and the reference temperature of Z3 is thermally leveled with that of Z2. In yet another example, for the nine-zone heater 103-B of FIG. 1D, the reference temperatures of Z2 to Z9 are thermally leveled with the reference temperature of Z1. Alternatively, the reference temperature of each outer zone (i.e., Z2 to Z9) is thermally leveled with that of Z1 and a selected adjacent outer zone. Accordingly, a reference temperature for a given zone (e.g., a first zone) is thermally leveled with that of an associated zone (e.g., a second zone) that is adjacent to the given zone.

With the zone temperatures at the selected temperature setpoint, the R-T calibration 302 converges the zone temperatures to the reference temperature. Specifically, the resistive heating elements 220 for each zone 222, 224 is driven toward a target temperature that may be the reference temperature or a temperature within a convergence band that is based on the reference temperature (e.g., reference temperature±0.5° C.; reference temperature±(0.5%*reference temperature). The R-T calibration 302 is configured to determine, for each zone 222, 224, if the target temperature for a given zone is different from the temperature of the resistive heating element 220 of the zone 222, 224 (i.e., "zone temperature") and performs an incremental resistance control to adjust resistance values provided in the dynamic R-T model. Specifically, if the target temperature for a respective zone is greater than the temperature of the resistive heating element 220 of the respective zone, the resistance value in the dynamic R-T model 306 is incrementally decreased. If the target temperature for a respective zone is less than the temperature of the resistive heating element 220, the resistance value is incrementally increased. By incrementally adjusting the resistance values associated with the temperature setpoint, the dynamic calibration control 214 may reduce or inhibit temperature spikes that may trigger faults. For example, the resistance values provided in the table 400 of FIG. 4 may be adjusted every second by a defined increment provided by the following equation in which T_RHE is temperature for a respective zone, Ref_Temp is reference temperature associated with the respective zone, and GF is a gain factor (e.g., 0.5 milliohms per seconds, among others) that can be predefined based on various characteristics of the thermal system: Defined Increment=I (T_RHE-Ref_Temp)/GF) I.

Once the resistive heating elements of the inner zone 222 and the outer zone 224 are at the target temperature (e.g., reference temperature or a temperature within a convergence band), the resistance values for the temperature setpoint is considered calibrated and the R-T calibration 302 continues to the next temperature setpoint of the dynamic R-T model 306 to calibrate the resistance values. After each temperature setpoint is calibrated, the dynamic R-T model 306 is stored as the calibrated R-T model 212 to be used during standard operation of the pedestal heater 208.

Figure 5A:
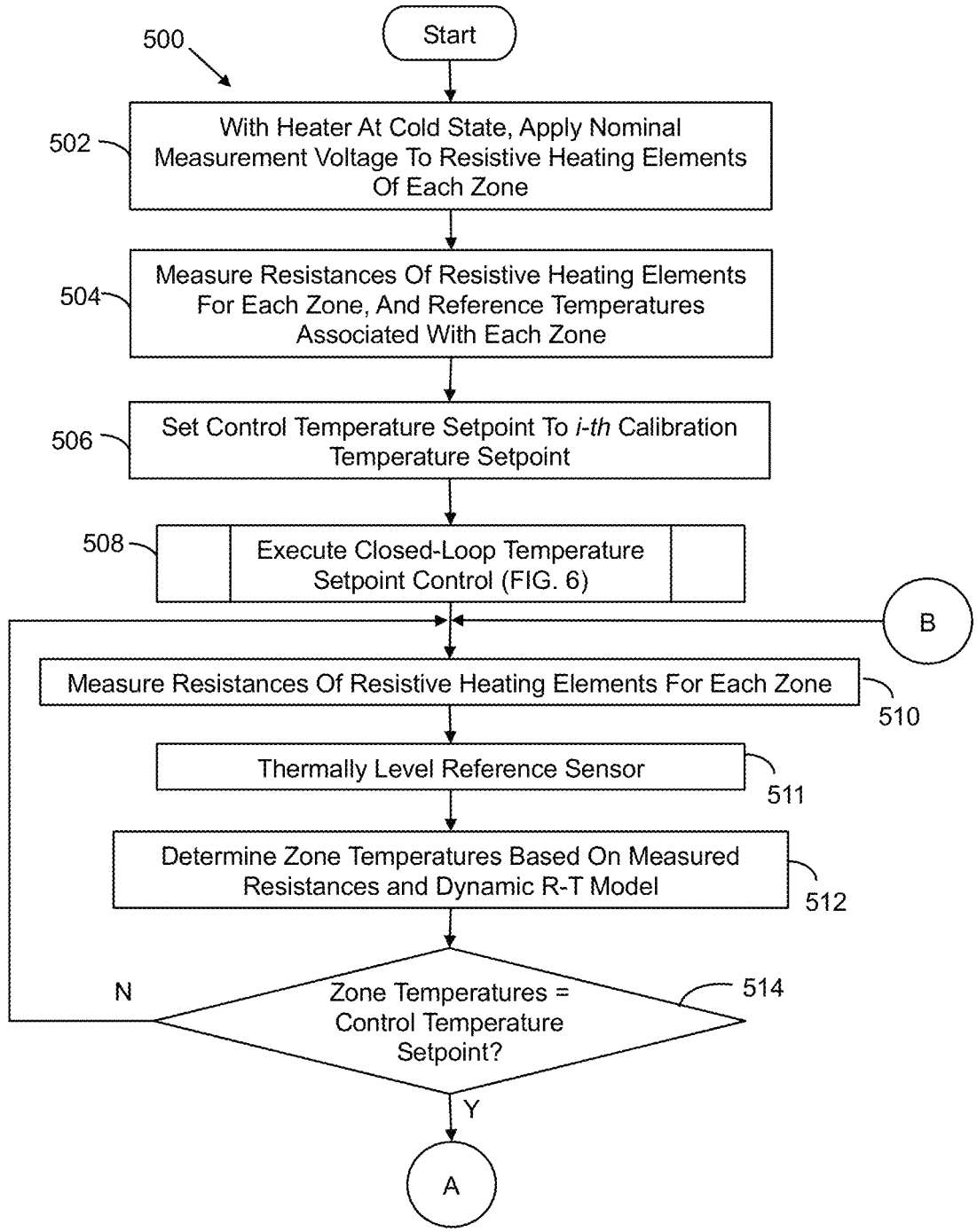
FIGS. 5A and 5B are flowcharts of a dynamic calibration control routine in accordance with the present disclosure.
Figure 5B:
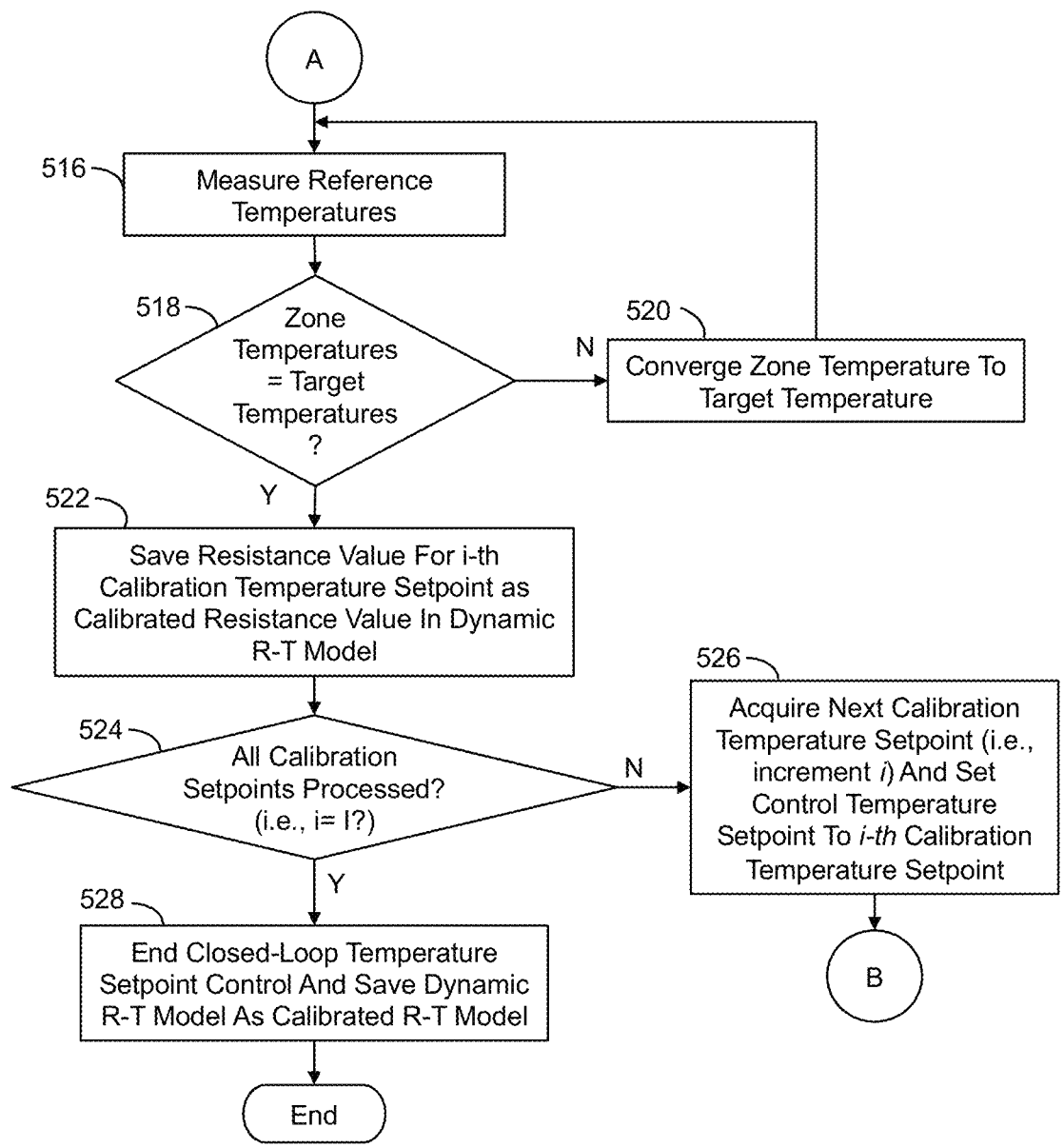
Figure 6:
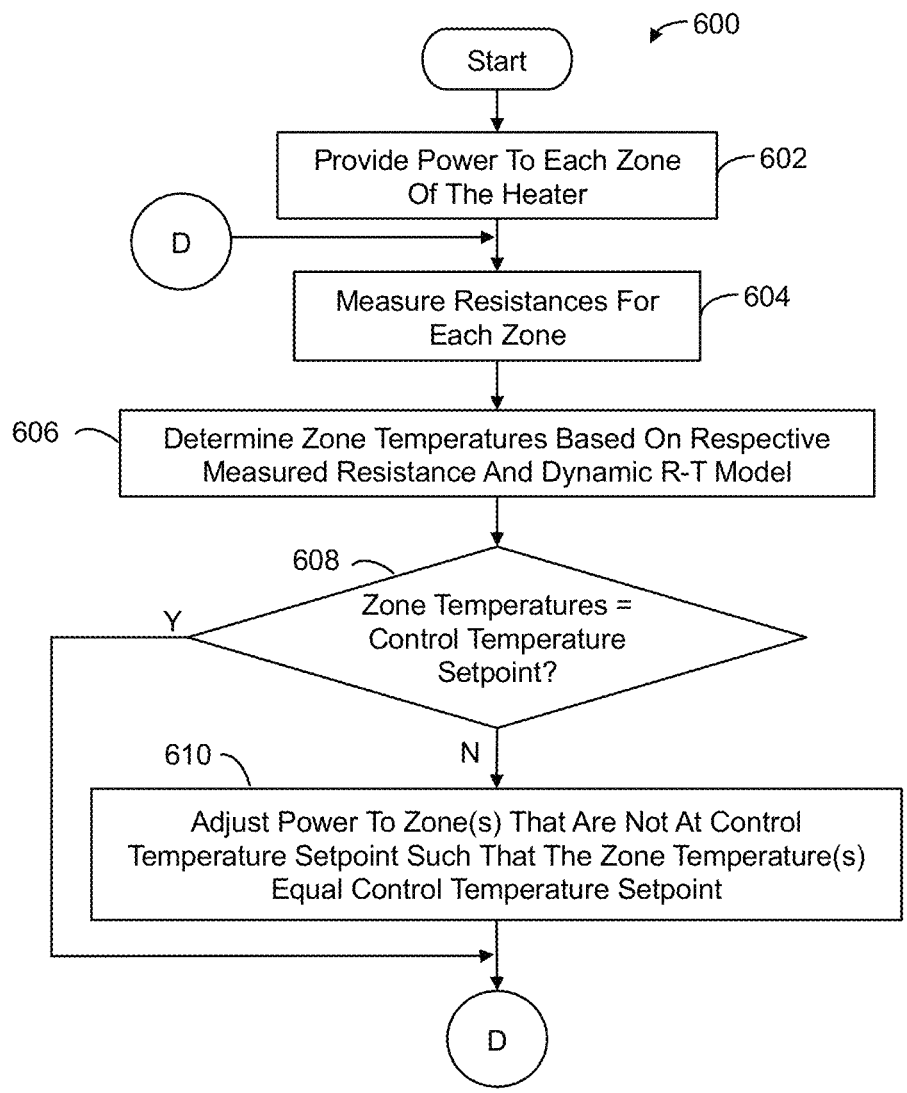
FIG. 6 is a flowchart of a closed-loop temperature setpoint control routine of FIG. 5A.

Referring to FIGS. 5A, 5B and 6, an example dynamic calibration control routine 500 is provided and is performable by the control system (104, 206) of the present disclosure to calibrate the multizone heater (102, 208). Prior to execution, the reference sensor(s), such as a TC wafer 228 and/or center TC 226, are arranged at the heater 208. The dynamic calibration control routine 500 is just one example of the dynamic calibration control of the present disclosure, and other suitable routines maybe used for performing the dynamic calibration control of the present disclosure.

With the heater 102, 208 at a cold state, the control system 104, 206, at 502, applies a nominal measurement voltage (e.g., 5V) to the resistive heating elements. In one form, the nominal measurement voltage provides sufficient power to measure voltage and/or current but inhibits the resistive heating elements from generating heat. At 504, the control system measures resistance of the resistive heating elements at each zone of the heater 102, 208 using data from the sensor circuits and associates the measured resistance with a cold-state temperature provided in the dynamic R-T model. For example, in FIG. 4, the cold-state temperature is provided as 20.35° C., and the associated resistances of the inner and outer zones are recorded. At 504, the control system 104, 206 further measures the reference temperatures associated with each of the zones. The cold start measurement provides a homogeneity measurement of the resistive heating elements and reference sensors, and may be provided as a first temperature setpoint measurement. While the reference temperature is not illustrated, this data may be stored as part of the dynamic R-T model.

At 506, the control system sets a control temperature setpoint to i-th calibration temperature setpoint or the next calibration point based on the dynamic R-T model. For example, in FIG. 4, the dynamic R-T model is to be calibrated for four temperature setpoints with the next calibration setpoint being 250° C. At 508, the control system executes a closed-loop temperature setpoint control 600, which is provided in FIG. 6.

With reference to FIG. 6, the control system 104, 206, at 602 and 604, provides power to each zone and measures the resistance of the resistive heating element for each zone as described above. At 606, the control system 104, 206 determines zone temperatures (i.e., temperature of the resistive heating elements for each zone) based on measured resistances for a respective zone and the dynamic R-T model. For each of the zones, the control system 104, 206 determines if the zone temperature is equal to the control temperature setpoint, at 608. If no, power to the particular zone is adjusted such that the zone temperature is equal to the control temperature setpoint, at 610. The control system then returns to 604 and continues to control the temperature of each zone to the control temperature setpoint.

Referring back to FIG. 5A, as the control system 104, 206 performs the closed-loop temperature setpoint control 600, the system continues with the dynamic calibration control routine 500 to determine if the zone temperatures are at the control temperature setpoint. Accordingly, at 510, the control system 104, 206 measures resistances of the resistive heating elements for the zones and at 511 thermally levels the reference sensor, as described above. At 512, the control system 104, 206 determines zone temperatures based on the resistances of the zones and the dynamic R-T model. At 514, for each of the zones, the control system determines if the zone temperature is equal to the control temperature setpoint. If not, the control system returns to 510 and waits until the zones reach the control temperature setpoint.

In one form, once the zones reach the control temperature setpoint, the control system maintains the zone temperatures for a set time period (e.g., 2 mins, 5 mins, etc.,) to let the calibration system equalize and stabilize before driving the zone temperature to the target temperatures or more particularly, the reference temperatures as described herein. Referring to FIG. 5B, at 516, the control system 104, 206 measures the reference temperature for each zone using one or more reference sensors, and at 518 determines if each zone temperature equals a respective reference temperature. If not, for a given zone that is not equal to its respective reference temperature, the control system 104, 206 converges the zone temperature and the reference temperature by incrementally adjusting resistance setpoint provided in dynamic R-T model, at 520. As provided above, in one form, the control system 104, 206 determines a resistance adjustment rate based on a predefined gain factor and difference between the reference temperature associated with a zone and the zone temperature. In one form, the resistance value is incrementally decreased when the reference temperature associated with the zone is greater than the zone temperature. Alternatively, the resistance value is incrementally increased when the reference temperature associated with the zone is less than the zone temperature.

For example, with reference to FIG. 4, if the temperature of the inner zone does not equal the inner reference temperature, the control system incrementally changes the resistance value, 61.20Ω, for the given temperature setpoint (250° C.). That is, FIG. 7 illustrates a dynamic R-T model 700 with an adjusted resistance value for the inner zone to 61.15Ω. Keeping in mind that the control system 104, 206 is concurrently performing the closed-loop temperature setpoint control 600, the heater 102, 208 uses the adjusted resistance value for controlling the temperature of the inner zone to the control temperature setpoint, thereby converging the reference temperature and the zone temperature. The resistance value is incrementally adjusted at the defined rate as described above until the reference temperature and the zone temperature, which is being maintained at the temperature setpoint, are the same. In lieu of comparing the zone temperature to the reference temperatures and converging to the reference temperature in steps 518 and 520, the control system 104, 206 may compare and converge the zone temperature to a temperature within a defined convergence band that is based on the reference temperature. And thus, the zone temperature is more generally compared and converged to a target temperature.

Referring back to FIG. 5B, once the zone temperatures equal the reference temperatures or are within respective convergence band, the control system 104, 206, at 522, saves the resistance values provided in the dynamic R-T model for the control temperature setpoint as the calibrated resistance value. At 524, the control system determines if all of the calibration setpoints were processed. For example, in FIG. 4, the control system may determine that two of the four temperature setpoints have been calibrated, and thus, proceeds to the next temperature setpoint (i.e., 450° C.). Accordingly, at 526, the control system sets the control temperature setpoint to the i-th calibration setpoint and returns to 510. Alternatively, if all the calibration setpoints are processed, the control system ends the closed-loop temperature setpoint control and saves the dynamic R-T model as the calibrated R-T model, at 528.

It should be readily understood that the routines 500 and 600 can be configured in various suitable ways and should not be limited to the steps described herein. For example, the dynamic calibration control routine 500 may not include a thermal leveling step. Accordingly, at 520, the control system just converges the zone temperature with the reference temperature.

It should be readily understood that the temperature setpoint and resistance values provided in FIGS. 4 and 7 are for explanation purposes only, and that the calibration R-T model can define other temperature setpoints and any number of temperature setpoints.

Figure 8:
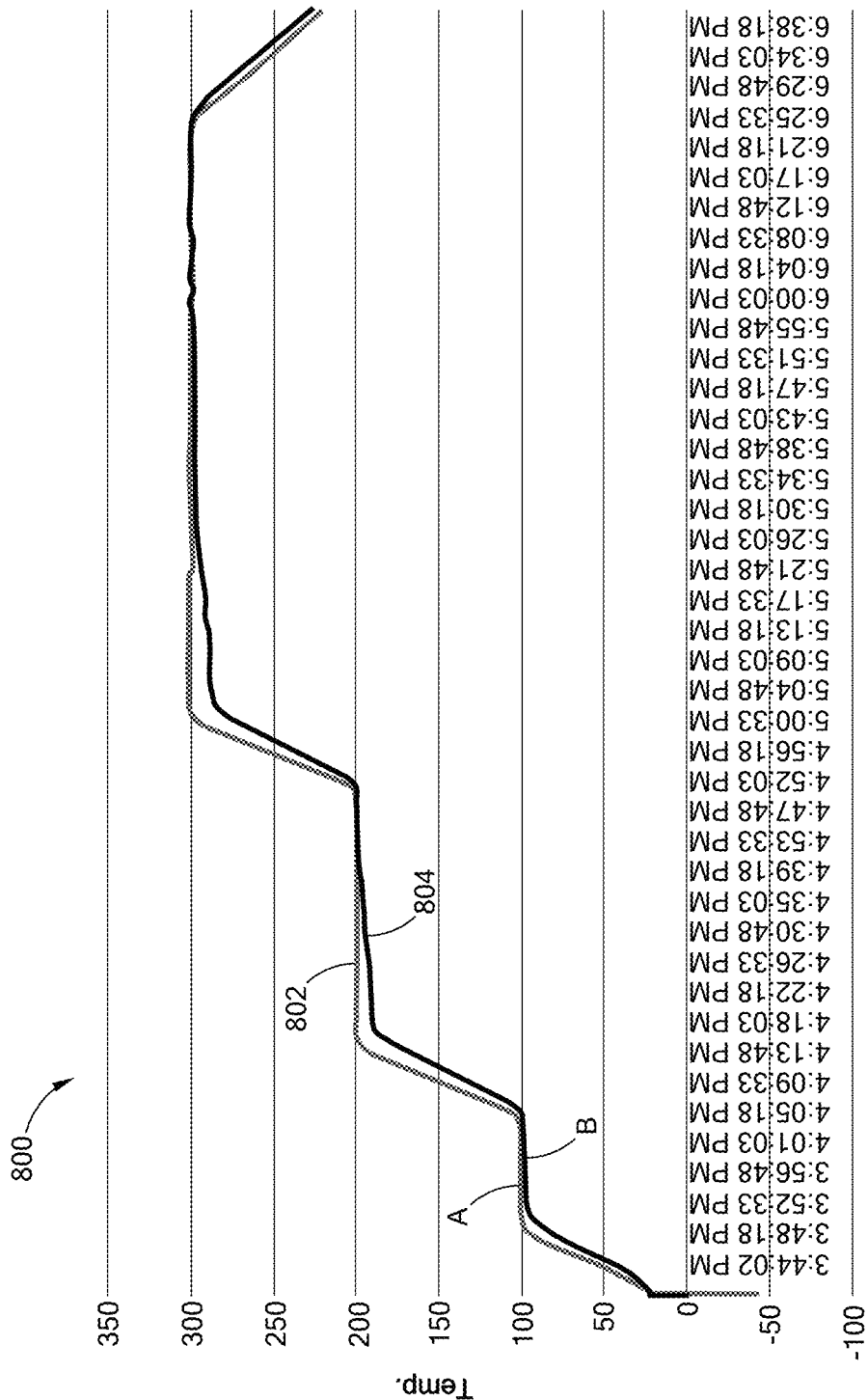
FIG. 8 is an example of a dynamic calibration graph in accordance with the present disclosure.

Referring to FIG. 8, a dynamic calibration graph 800 illustrates an example convergence of a zone temperature and a reference temperature as the resistance value is modified during the dynamic calibration control. Here, line 802 illustrates temperature of the resistive heating element of a first zone and line 804 illustrates the reference temperature associated with the first zone. At cold start (e.g., about 25° C.), the initial resistance of the first zone would be recorded and saved in the dynamic R-T model. The temperature of the first zone would then be controlled to the next temperature setpoint (e.g., 100° C.). Once the first zone is at 100° C. (around point A in FIG. 8), the control system recognizes that the zone temperature and the reference temperature are not the same and would begin to adjust the resistance value associated with temperature setpoint for the first zone in the dynamic R-T model at a defined rate (e.g., 0.5 milliohms per second or other suitable rates). Once the reference temperature and the zone temperature converge (at about point B in graph 900), the control system would save the resistance value associated with 100° C. setpoint as the calibrated resistance value for the first zone and continue to the next temperature setpoint (e.g., 200° C.).

In one form, the dynamic calibration control may be configured to measure a thermal response of the heater when power to the heater is adjusted and/or when an external system variable is adjusted. For example, with the zone temperatures at the temperature setpoint, the control system may apply a voltage pulse or energy pulse to each of the zones and measure a thermal response of the zones.

Figure 9:
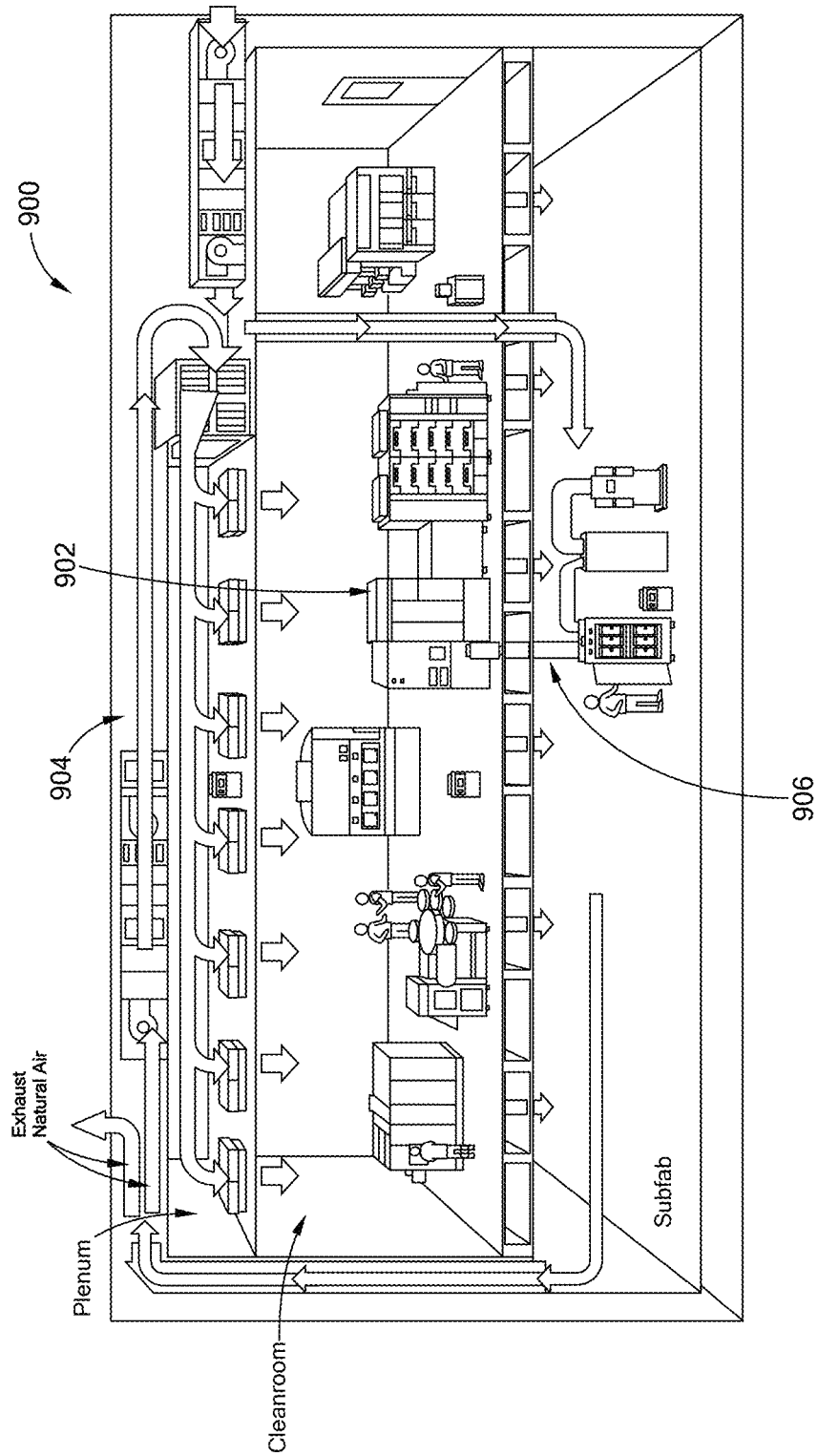
FIG. 9 is an example of a semiconductor process lab having in accordance with the present disclosure.

Referring to FIG. 9, in an example application, the control system of the present disclosure is provided in a semiconductor process lab 900 that includes at least one chamber 902 having one or more heaters (not shown) disposed therein. The heaters may be configured in a similar manner as that of heaters 102 and 208. While not illustrated, one or more control systems, similar to the control system 104 and 206, are provided to control the heaters. The lab 900 includes other subsystems for processing semiconductor wafers, and those subsystems may influence the thermal response of the heaters. For example, a fluid line system, having delivery lines 904 and exhaust lines 906, transports process gases to and from the chamber 902. The gas flow rate and even pressure within the chamber are example external system variables. With the zone temperatures at the temperature setpoint, one or more external system variables may be adjusted by respective sub-systems and the control system measures the thermal response of the zones of the heater. The external system variable may include, but is not limited to: chamber pressures, backside gas pressures, emissivity of the chamber 902, and/or emissivity of pedestal. It should be readily understood that the lab 900 includes other sub-systems that can influence the operation of the heater and that the present disclosure should not be limited to the examples provided herein.

The dynamic calibration control of the present disclosure performs a live calibration of a R-T model used by the control system for determining the temperature of the heater. Thus, the dynamic calibration control improves the accuracy of the R-T model and the temperature measurements. Further, the incremental adjustments made to the resistance values may reduce or inhibit false measurements (e.g., temperature spikes) and improve accuracy of the calibrated resistance value.

It should be readily understood, that while specific components are illustrated and described, the thermal system may include other components while remaining within the scope of the present disclosure. For example, in one form, the control system may include electronic components that isolate low voltage components from high voltage components and still allow the components to exchange signal.

In this application, the term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of dynamically calibrating a heater having a plurality of zones defined by one or more resistive heating elements, the method comprising:
   controlling power to the heater based on a dynamic resistance-temperature (R-T) model to control a temperature of the heater to a temperature setpoint;
   for each of the plurality of zones,
      measuring a temperature of a respective zone based on a resistance of the one or more resistive heating elements of the respective zone and the dynamic R-T model;
      measuring a reference temperature for the respective zone; and
      incrementally adjusting a resistance value associated with the temperature setpoint provided in the dynamic R-T model for the respective zone to a calibrated resistance value using a resistance adjustment rate, wherein, for the respective zone, the resistance adjustment rate is determined based on a difference between the reference temperature associated with the respective zone and the temperature of the respective zone; and
   providing the dynamic R-T model that correlates the calibrated resistance values of the plurality of zones with the temperature setpoint as a calibrated R-T model.

2. The method of claim 1, wherein controlling power to the heater further comprises:
   measuring resistances of the one or more resistive heating elements;
   determining the temperature of each of the plurality of zones based on the measured resistances of the one or more resistive heating elements of the respective zone and the dynamic R-T model; and
   adjusting power to the respective zone in response to the temperature of the respective zone being different from the temperature setpoint until the temperature of the respective zone is equal to the temperature setpoint.

3. The method of claim 2, wherein when the temperature of each of the plurality of zones equals the temperature setpoint, the method further comprises applying a voltage pulse to the plurality of zones and measuring a thermal response of the plurality of zones.

4. The method of claim 2, wherein when the temperature of each of the plurality of zones equals the temperature setpoint, the method further comprises adjusting an external system variable and measuring a thermal response of the plurality of zones, wherein the external system variable includes chamber pressures, backside gas pressures, gas flow rates, an emissivity of a chamber, an emissivity of a pedestal, or a combination thereof.

5. The method of claim 1, wherein the resistance adjustment rate is further based on a predefined gain factor.

6. The method of claim 1, wherein incrementally adjusting the resistance value further comprises:
  decreasing the resistance value associated with the respective zone when the reference temperature of the respective zone is greater than the temperature of the respective zone; and
  increasing the resistance value associated with the respective zone when the reference temperature of the respective zone is less than the temperature of the respective zone, wherein decreasing and increasing the resistance value associated with the respective zone is performed at a defined rate based on the resistance adjustment rate for the respective zone, and wherein the defined rate for one or more zones of the plurality of zones is different than the defined rate for one or more other zones of the plurality of zones.

7. The method of claim 1, wherein the reference temperatures of the plurality of zones are measured by one or more sensors.

8. The method of claim 1 further comprising:
  applying a nominal measurement voltage to each of the plurality of zones; and
  measuring a cold start resistance for each of the plurality of zones prior to controlling the temperature of the heater to the temperature setpoint.

9. The method of claim 1, wherein:
  the temperature setpoint is selected from among a plurality of temperature setpoints and the calibrated resistance value for each of the zones is determined for each of the plurality of temperature setpoints, and
  the dynamic R-T model provides, for each of the plurality of temperature setpoints, the calibrated resistance values for each of the plurality of zones.

10. The method of claim 1 further comprising thermally leveling the reference temperatures of the plurality of zones such that the reference temperature for a first zone is substantially the same as that of a second zone that is associated with the first zone.

11. The method of claim 1 further comprising, for each of the zones:
  determining whether the temperature of the respective zone is equal to the reference temperature of the respective zone, wherein the resistance value is incrementally adjusted in response to the temperature not equaling the reference temperature; and
  storing the resistance value as the calibrated resistance value for the respective zone in response to the temperature of the respective zone equaling the reference temperature.

12. A method of dynamically calibrating a heater having a plurality of zones defined by one or more resistive heating elements, the method comprising:
  controlling power to the heater based on a dynamic resistance-temperature (R-T) model to control a temperature of the heater to a temperature setpoint;
  for each of the plurality of zones:
    measuring a reference temperature for a respective zone;
    measuring a zone temperature for the respective zone based on a resistance of the one or more resistive heating elements of the respective zone and the dynamic R-T model;
    determining, for the respective zone, whether the zone temperature is equal to the reference temperature;
    in response to the zone temperature not equaling the reference temperature, incrementally adjusting a resistance value associated with the temperature setpoint in the dynamic R-T model for the respective zone using a resistance adjustment rate, wherein, for the respective zone, the resistance adjustment rate is determined based on a difference between the reference temperature associated with the respective zone and the temperature of the respective zone; and
    in response to the zone temperature equaling the reference temperature, providing the resistance value in the dynamic R-T model as a calibrated resistance value for the temperature setpoint; and
  storing the dynamic R-T model as a calibrated R-T model in response to the calibrated resistance value being provided for each of the plurality of zones.

13. The method of claim 12 further comprising thermally leveling the reference temperatures of the plurality of zones such that the reference temperature for a first zone is substantially the same as that of a second zone associated with the first zone.

14. The method of claim 13, wherein the resistance value is stored in the dynamic R-T model as the calibrated resistance value for the temperature setpoint in response to the zone temperature equaling the reference temperature and the plurality of reference temperatures being thermally leveled.

15. The method of claim 12, wherein:
  the temperature setpoint is selected from among a plurality of temperature setpoints, and the calibrated resistance value is determined for each of the plurality of temperature setpoints, and
  the dynamic R-T model provides, for each of the plurality of temperature setpoints, the calibrated resistance values for each of the plurality of zones.

16. The method of claim 12, wherein incrementally adjusting the resistance values further comprises determining the resistance adjustment rate based on a predefined gain factor and a difference between the reference temperature and the zone temperature of the respective zone.

17. The method of claim 12, wherein incrementally adjusting the resistance value for the respective zone further comprises:
  decreasing the resistance value associated with the respective zone when the reference temperature of the respective zone is greater than the temperature of the respective zone; and
  increasing the resistance value associated with the respective zone when the reference temperature of the respective zone is less than the temperature of the respective zone.

18. A control system for controlling power to a heater having a plurality of zones, each of the plurality of zones being defined by one or more resistive heating elements, the control system comprising:
  a controller configured to control power to the heater and determine a temperature of each of the plurality of zones based on a calibrated resistance-temperature (R-T) model, the controller being configured to execute a dynamic calibration process to define the calibrated R-T model, wherein the dynamic calibration process comprises:
    performing, using a dynamic R-T model, a closed-loop temperature control to maintain temperature of the heater to a temperature setpoint;
    for each of the plurality of zones,
      obtaining a reference temperature for a respective zone;
      thermally leveling the reference temperature of the respective zone with one or more other reference temperatures by adjusting a resistance value associated with the respective zone in response to the temperature of the heater not equaling the temperature setpoint;

measuring a zone temperature for the respective zone based on the resistance value of the one or more resistive heating elements of the respective zone and the dynamic R-T model for the respective zone;

determining, for the respective zone, whether the zone temperature is equal to the reference temperature;

in response to the zone temperature not equaling the reference temperature, incrementally adjusting the resistance value associated with the temperature setpoint provided in the dynamic R-T model for the respective zone using a resistance adjustment rate, wherein, for the respective zone, the resistance adjustment rate is determined based on a difference between the reference temperature associated with the respective zone and the temperature of the respective zone; and in response to the zone temperature equaling the reference temperature and the reference temperature being thermally leveled, providing the resistance value in the dynamic R-T model as a calibrated resistance value for the temperature setpoint for the respective zone; and storing the dynamic R-T model that correlates the calibrated resistance value with the temperature setpoint for the plurality of zones as the calibrated R-T model.

19. The control system of claim 18, wherein incrementally adjusting the resistance value further comprises, determining the resistance adjustment rate based on a predefined gain factor and a difference between the reference temperature and the zone temperature of the respective zone.

20. The control system of claim 18, wherein incrementally adjusting the resistance value for the respective zone further comprises:

decreasing the resistance value associated with the respective zone when the reference temperature of the respective zone is greater than the temperature of the respective zone; and increasing the resistance value associated with the respective zone when the reference temperature of the respective zone is less than the temperature of the respective zone.

* * * * *